United States Patent [19]
Tanoi et al.

[11] Patent Number: 6,104,655
[45] Date of Patent: *Aug. 15, 2000

[54] SEMICONDUCTOR STORAGE DEVICE

[75] Inventors: Satoru Tanoi; Atsuhiko Okada, both of Tokyo, Japan

[73] Assignee: Oki Electric Industry Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/286,664

[22] Filed: Apr. 6, 1999

[30] Foreign Application Priority Data

Nov. 9, 1998 [JP] Japan .................................. 10-317341

[51] Int. Cl.⁷ ................................................ G11C 7/00
[52] U.S. Cl. ......................... 365/205; 365/207; 365/208
[58] Field of Search .................................. 365/205, 207, 365/208

[56] References Cited

U.S. PATENT DOCUMENTS

| | | | |
|---|---|---|---|
| 5,295,094 | 3/1994 | Miyatake | 365/182 |
| 5,323,349 | 6/1994 | Hamade et al. | 365/207 |
| 5,373,473 | 12/1994 | Okumura | 365/208 |
| 5,724,292 | 3/1998 | Wada | 365/207 |
| 5,894,445 | 4/1999 | Kobayashi | 365/208 |

OTHER PUBLICATIONS

Dram Cicuit, Advanced Electronics Series, pp. 85–86, pp. 202–213.

Hisashi Kato et al., "A Low Powerwide Voltage–Range Dram With 0.8V Array Operation" Technical Report Of IEICE, ICD97–19 (1997–05).

Primary Examiner—Richard Elms
Assistant Examiner—Hien Nguyen
Attorney, Agent, or Firm—Jones Volentine, LLP

[57] ABSTRACT

A semiconductor device that enables a reduction in power consumption and a stable operation, and which can be manufactured easily and with a high level of integration.

In an invention exemplifying the present application, a sense circuit constituting a DRAM comprises a bit line pre-charge circuit, a pre-amplifier circuit PSA100 and a main amplifier circuit MSA100. The pre-amplifier circuit is provide with a switch circuit and an amplifier circuit. The switch circuit comprises a switch element provided between input/output terminals and a pre-sense node, and a switch element provided between input/output terminals and another pre-sense node. The amplifier circuit comprises MOS transistors and switch elements.

7 Claims, 10 Drawing Sheets

SEMICONDUCTOR STORAGE DEVICE

BACKGROUND OF THE INVENTION

1. Field of the Invention

The present invention relates to a semiconductor storage device.

2. Description of the Related Art

Semiconductor storage devices such as DRAM are provided with sense amplifier sections, connected to memory cell arrays comprising memory cells for storing data arranged in a matrix, and to bit line pairs, for detecting data that has been read out from the memory cells and amplifying that data. In such a DRAM, one word line is selected by a row address signal and data stored in memory cells connected to the selected word line is read out onto a bit line pair. The data read onto the bit line pair is detected by the sense amplifier section and after amplification is output to a data bus via a column switch circuit.

In a semiconductor storage device of this type, for every access cycle, because the potential difference of all bit line pairs of the selected memory cell array is made maximum (maximum potential difference will be called "array drive voltage hereinafter) OV is applied to one leg of the bit line pair while the array drive voltage VDDarray is applied to the other leg of the bit line pair. In order to reduce the power consumption of the DRAM, it is desirable to keep the array drive voltage VDDarray low, but for a reliable read operation it is necessary for the a read potential difference ΔV occurring in the bit line pair to have a sufficient value. Therefore, in a conventional DRAM, it is difficult to simultaneously improve the reliability of the read operation and curtail power consumption.

To solve the above described problem, a DRAM provided with preamplifiers and main amplifiers in a sense amplifier section has been developed. These preamplifiers are normally constructed of a pair of transistors that are caused to conduct between the bit line pair and the main amplifiers at an operating point close to an off state of a saturation region as a result of gates being biased to a fixed voltage, and have a function to transfer a read potential difference ΔV occurring between the bit line pair to the main amplifiers.

However, even with the DRAM provided with the preamplifiers there are problems to be solved. An allowable range for the voltage to be supplied to the gates of the transistor pair constituting the preamplifiers is confined to a few tens of mV, and in order to obtain reliable operation it is necessary to maintain manufacturing quality at a high level, and this affects manufacturing costs.

Also, in the case of a conventional DRAM a time of 100 ns is necessary to carry out a so-called presense operation, which is amplification of the potential difference of the bit line pairs by preamplifiers carried out before amplification of the potential difference of the bit line pairs by the main amplifiers. The result of this is that in the most recent DRAMs having a read operation cycle of less than 50 ns a pre-sense operation requiring a time of 100 ns becomes meaningless.

Still further, in making the preamplifiers it is normally necessary to have a PMOS transistor and an NMOS transistor of different transistor type, and when such different transistor types are laid out on a wafer a space for preventing transistor latch up is wide compared to the case when the same type transistors are laid out on a wafer. This space hinders integration of the DRAM.

SUMMARY OF THE INVENTION

The object of the present invention is to provide a semiconductor storage device with reduced power consumption, stable operation, and which can be easily manufactured, as well enabling high integration.

In order to solve the above described problems, there is provided a semiconductor storage device comprising a memory cell array having memory cells, formed at crossing points of a plurality of word lines and a plurality of bit lines, arranged in the form of a matrix, and sense circuits, connected to bit line pairs, for detecting data read out from the memory cells and amplifying the data. The sense circuits provided in the semiconductor storage device include a preamplifier section for amplifying a potential difference of the bit line pair and a main amplifier section for further amplifying the potential difference that has been amplified by the pre-amplifier section, and the pre-amplifier and the main amplifier have the following structure.

The preamplifier section comprises a first switch circuit capable of electrically connecting or disconnecting one leg of a bit line pair, a second switch circuit capable of electrically connecting or disconnecting the other leg of a bit line pair, a third switch circuit, connected in series with the first switch circuit, capable of electrically connecting or disconnecting the one leg of the bit line pair, a fourth switch circuit, connected in series with the second switch circuit, capable of electrically connecting or disconnecting the other leg of the bit line pair, a first transistor having one electrode connected to one terminal of the third switch circuit another electrode connected the other terminal of the third switch circuit and a control electrode connected to one terminal of the fourth switch circuit, and a second transistor having one electrode connected to one terminal of the fourth switch circuit, another electrode connected to the other terminal of the fourth switch circuit and a control electrode connected to one terminal of the third switch circuit.

The main amplifier section comprises a first P channel type transistor having a source connected to a supply line of a first voltage supply a drain connected to one leg of a bit line pair and a gate connected to the other leg of the bit line pair, a second P channel type transistor having a source connected to a supply line of the first voltage supply a drain connected to the other leg of the bit line pair and a gate connected to the one leg of the bit line pair, a first N channel type transistor having a source connected a supply line of a second voltage supply via a fifth switch circuit a drain connected to the one leg of the bit line pair and a gate connected to the other leg of the bit line pair, and a second N channel type transistor having a source connected to the supply line of the second voltage supply via the fifth switch circuit a drain connected to the other leg of the bit line pair and a gate connected to the one leg of the bit line pair.

With this structure, it is possible to carry out a pre-sense operation by controlling the on/off state of the first switch circuit and the second switch circuit. That is, it is possible to stabilize the operation of the semiconductor storage device without supplying a voltage that has been very precisely regulated to the preamplifier section. Also, since the first transistor and the second transistor are formed so that they respectively supply positive feedback to each other, the time required for a pre sensing operation is reduced.

Further, by constituting the first switch circuit, second switch circuit, third switch circuit and fourth switch circuit of transistors having the same conductivity type as the first transistor and second transistor, the surface area required by the sense circuit section is reduced and it is possible to efficiently miniaturize the semiconductor storage device.

It is also possible to provide, in the sense circuit section, a bit line pre-charging circuit, comprised of a third transistor and a fourth transistor having the function of pre-charging the bit line pair to a pre-charge potential. With this structure, since the bit line pair are pre-charged to a predetermined potential by the bit line pre-charge circuit it is possible to suppress the occurrence of noise during the sense operation. By making the third transistor and fourth transistor of the same conductivity type as the first transistor and second transistor it is possible to keep the circuit surface area of the bit line pre-charge circuit to a minimum.

Making the pre-charge potential less than half the first supply potential realizes power reduction of the sense circuit section.

It is also possible to provide a equalizer circuit in the sense circuit section for equalizing the potential of a connection node between the first switch circuit and the third switch circuit, and the potential of a connection node between the second switch circuit and the fourth switch circuit. With this structure, even if differences occur in threshold potential between transistors due to manufacturing variations etc. of the semiconductor storage device, these differences in threshold potential can be absorbed by the equalizing circuit.

The third switch circuit and the first transistor are formed in a first impurity diffusion region, the fourth switch circuit and the second transistor are formed in a second impurity diffusion region, a control electrode of a transistor constituting the third switch circuit is connected to one control signal supply line formed along the word lines, and the control electrode of the transistor constituting the fourth switching circuit is connected to another control signal supply line formed along the word lines. For example, by aligning the first impurity diffusion region and the second impurity diffusion region in the bit line direction, it is possible to make the above described semiconductor storage device in a minimum surface area.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings, in which:

DESCRIPTION OF THE PREFERRED EMBODIMENTS

Figure 1:
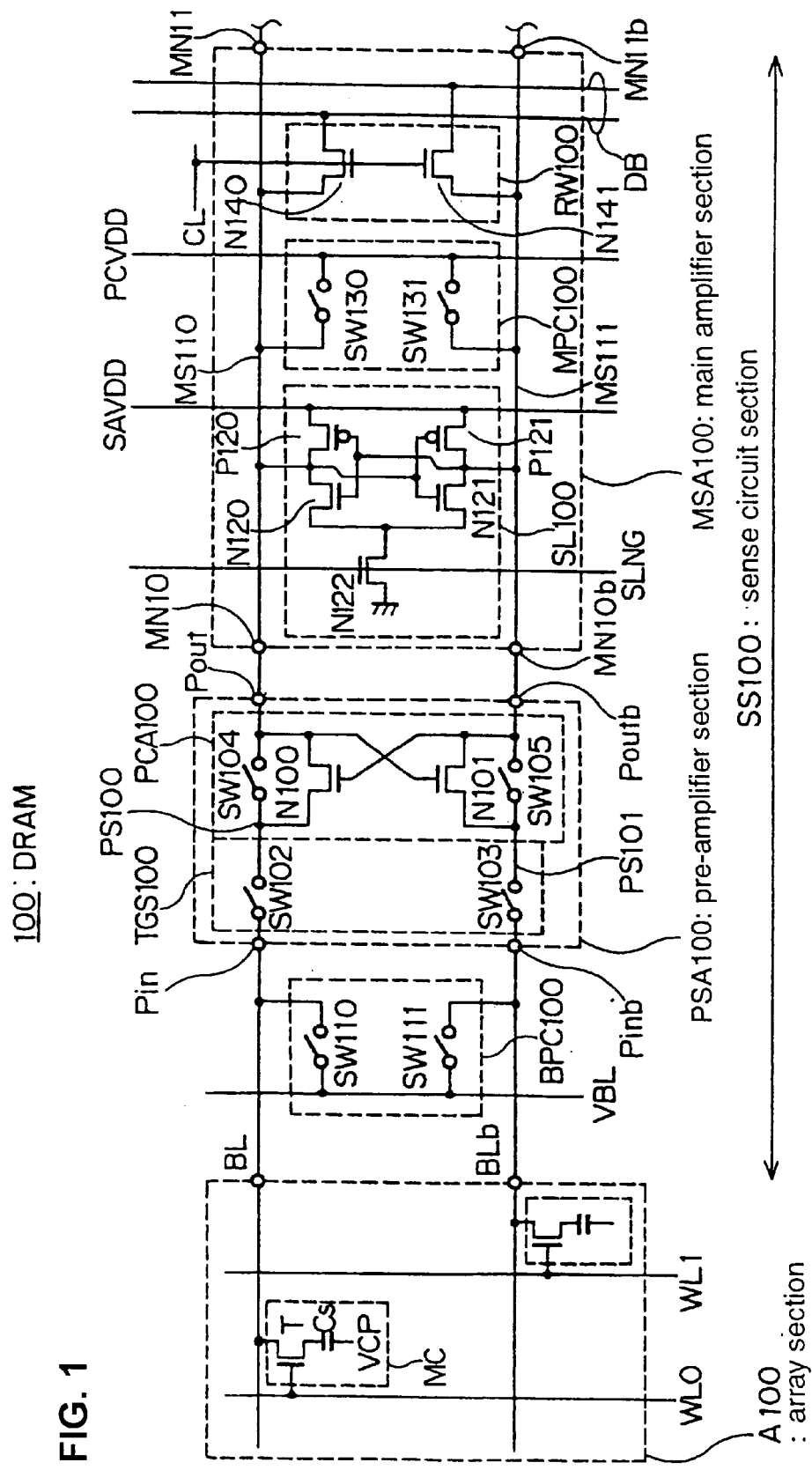
FIG. 1 is a circuit diagram showing the structure of a DRAM of a first embodiment of the present invention.

Preferred embodiments of a semiconductor storage device off the present invention will now be described in detail below, with reference to the attached drawings. In the following description, structural element having the same function and structure have the same reference numerals attached thereto, am repeat descriptions of such parts will be omitted.

A DRAM 100 of a first embodiment of the present invention is shown in FIG. 1. This DRAM 100 is provided with an array section A100 and a sense circuit section SS100.

The array section A100 is provided with a plurality of word lines WL0, WL1, . . . and a plurality of bit line pairs BL, BLb . . . , with memory cells MC being arranged alternately at crossing parts of each word line and each bit line pair. The memory cells MC are formed of a MOS transistor T and a storage capacitor Cs, with a gate of the transistor T being connected to a word line, the source being connected to one terminal of the storage capacitor Cs and the drain being connected to each bit line. Also, the other terminal of the storage capacitor Cs is connected to a power supply terminal VCP. The power supply terminal VCP is biased to a fixed potential during operation of the DRAM 100.

The sense circuit section SS100 is connected to each of the bit line pairs BL, BLb, and comprises bit line pair pre-charge means BPC100, a pre-amplifier section OSA100 and a main amplifier section MSA100.

The bit line pair pre-charge means BPC100 comprises a switching element SW110 provided between the bit line BL and a supply line of a pre-charge potential VBL, and a switching element SW111 provide between the bit line BLb and the supply line of the pre-charge potential VBL, and functions to pre-charge the bit line pair BL, BLb to the pre-charge potential VBL.

The pre-amplifier section PSA100 is provided with a pair of input/output terminals Pin, Pinb for connecting to each of the bit line pairs BL, BLb, and a pair of input output terminals Pout, Poutb for connecting to the main amplifier section MSA100. A switch circuit TGS100 is provided between the pair of input/output terminals Pin, Pinb and a pre-sense circuit internal node pair PS100, PS101 (hereinafter called "pre-sense node pair"), while an amplifier circuit PCA100 is provided between the pre-sense node pair PS100, PS101 and the pair of input/output terminals Pout, Poutb. The switch circuit TGS100 is comprised of a switch element SW102 as a first switching circuit provided between the input/output terminal Pin and the pre-sense node PS100, and a switch element SW103 as a second switching circuit provided between the input/output terminal Pinb and the pre-sense node PS101. Also, the amplifier circuit PCA100 comprises N channel type MOS transistors N100, N101 (hereinafter called "NMOS transistors") as first and second transistors, each having a gate connected to a drain of the other, and switch elements SW104 and SW105 as third and fourth switch circuits. The source of NMOS transistor N100 is connected to pre-sense node PS100, the gate of NMOS transistor N100 is connected to the input/output terminal Poutb and the drain is connected to pre-sense node PS101. The source of NMOS transistor N101 is connected to pre-sense node PS101, the gate of NMOS transistor N100 is connected to the input/output terminal Pout and the drain is connected to input/output terminal Poutb. The switch element SW104 is provided between the pre-sense node PS100 and the input/output terminal Pout, while the switch element SW105 is provided between the pre-sense node PS101 and input/output terminal Poutb. The pre-amplifier section PSA100 having the above described structure partially amplifies a potential difference between the bit line pair BL and BLb, and transmits the amplified potential difference to the main amplifier section SA100.

The main amplifier section MSA100 further amplifies the potential difference between the bit line pair BL, BLb that has Inc been amplified by the pre-amplifier section PSA100. A pair of input/output terminals MN10, MN10b that are connected to the pair of input/output terminals Pout, Poutb of the pre-amplifier section PSA100 are provided in the main amplifier section MSA100. The input/output terminal MN10 connected to the input/output terminal MN11 in a feed through manner via main sense node MS110, and the input/output terminal MN10b is connected in a feed through manner to the input/output terminal MN11b via the main sense node MS111.

A sense latch circuit SL100, a main sense node pre-charge circuit MPC100 and a data transmission circuit RW100 are connected in parallel between the main sense nodes MS110 and MS111.

The sense latch circuit SL100 comprises NMOS transistors N120 and N121, each having a gate connected to the drain of the other, as first and second N channel transistors, P channel MOS transistors P120, P121 (hereinafter called "PMOS transistors"), each having a gate connected to the drain of the other, as first and second P channel transistors, and an NMOS transistor N122 as a fifth switch circuit for controlling the ON/OFF state of the sense latch circuit SL100. The sources of the MNOS transistors N120 and N121 are connected to the drain of MNOS transistor N122. The gate of NMOS transistor N122 is connected to a supply line of a control signal SLNG, and the source of NMOS transistor N122 is connected to a power supply potential VSS (=0V) as a second power supply potential. The sources of the PMOS transistors P120 and P121 are connected to a supply line of a power supply potential SAVDD as a first power supply potential.

The main sense node pre-charge circuit MPC100 comprises a switch element SW130 provided between the main sense node MS110 and a supply line of a pre-charge potential PCVDD, and a switch element SW131 provided between the main sense node MS111 and the supply line of the pre-charge potential PCVDD. The pre-charge potential PCVDD supplied by the pre-charge potential supply line is regulated so that it is sufficiently higher than power supply potential SAVDD.

The data transmission circuit RW100 comprises NMOS transistors N140 and N141 provided between a data bus line pair DB and the main sense nodes MS110 and MS101.

Figure 2:
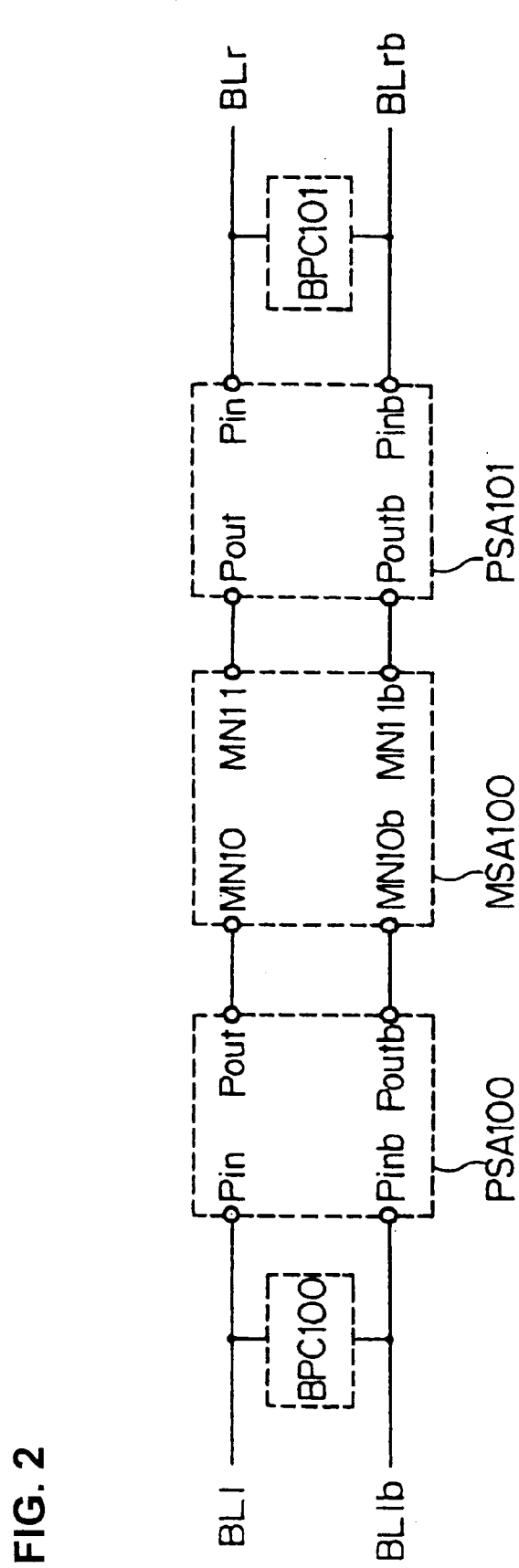
FIG. 2 is a block diagram for the case where the sense circuit shown in FIG. 1 is shared by a plurality of array sections.

A DRAM100 of a first embodiment structured as described above comprises array sections A100 and sense circuit sections SS100 provided on a one-to-one basis, as shown in FIG. 1, but with the structure shown in FIG. 2 it is possible to share one sense circuit section among a plurality of adjacent array sections.

In this case, the sense circuit section comprises a first bit line pre-charge circuit BPC100, a second bit line pre-charge circuit BPC101, a first pre-amplifier section PSA100, a second pre-amplifier section PSA101, and a main amplifier section MSA100. The internal circuitry of the first bit line pre-charge circuit BPC100 and the second bit line pre-charge circuit BPC101 is substantially the same. Similarly, the internal circuitry of the first pre-amplifier section PSA100 and the second pre-amplifier section PSA101 is substantially the same.

The bit line pair BL1, BL1b are connected to an input/output terminal pair of the first bit line pre-charge circuit BPC100 and input/output terminal pair Pin, Pinb of the first preamplifier section PSA100. The input/output terminal pair Pout, Poutb of the first pre-amplifier section PSA100 are connected to input/output terminal pair MN10, MN10b of the main amplifier section MSA100. The input/output terminal pair MN11, MN11b of the main amplifier section MSA100 are connected to the input/output terminal pair Pout, Poutb of the second preamplifier section PSA101. The input/output terminal pair Pin, Pinb of the second pre-amplifier section PSA101 are connected to an input/output terminal pair of the second bit line pre-charge circuit BPC10 and to the bit line pair BLr, BLrb. With this structure, one sense circuit section is shared between adjacent array sections.

Figure 3:
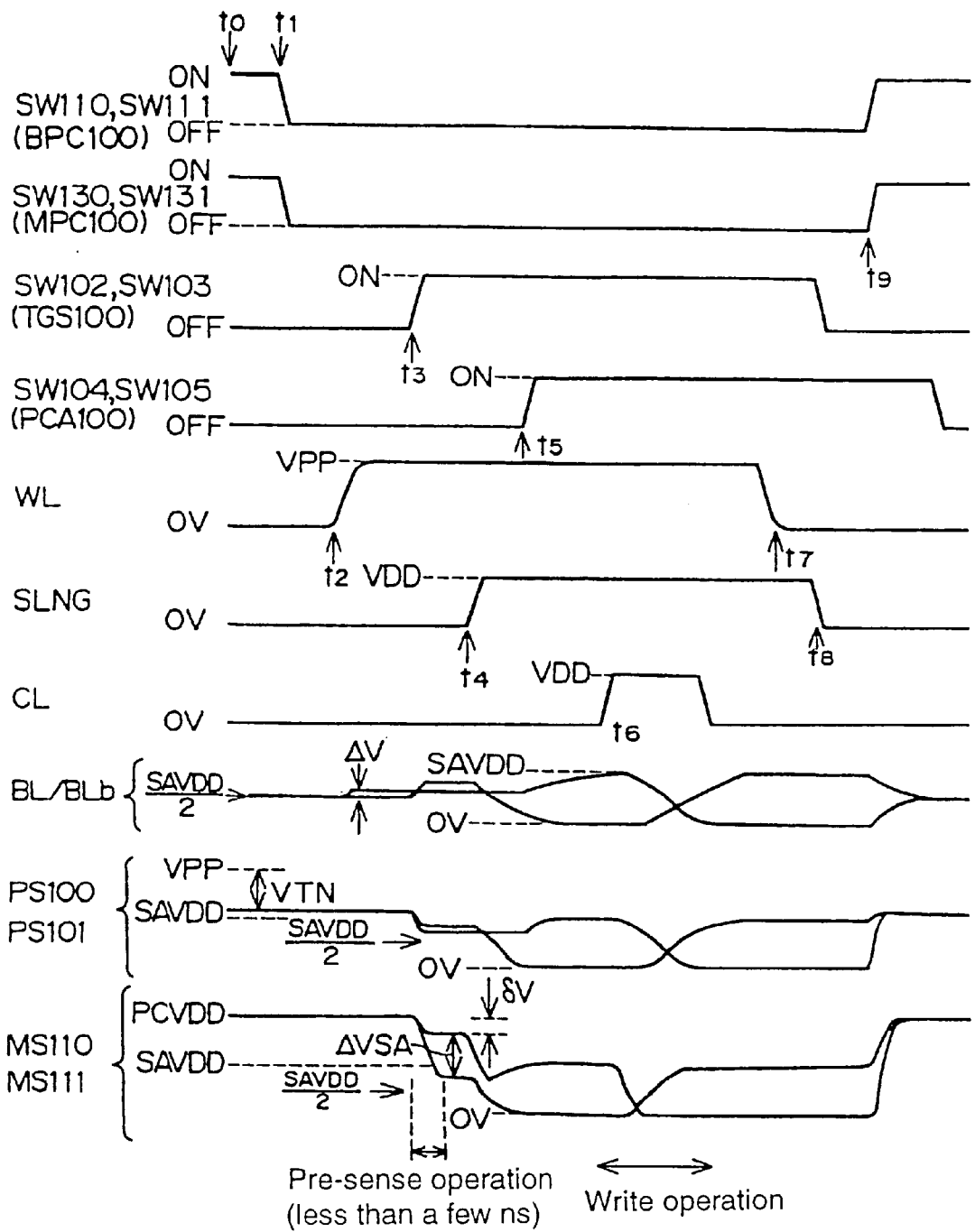
FIG. 3 is a timing chart for describing the operation of the DRAM shown in FIG. 1.

The operation of the DRAM100 of the first embodiment having the above described structure will now be described using FIG. 3. FIG. 3 is a timing chart showing a read operation and a write operation of the DRAM100. A power supply potential SAVDD is used as an array operation voltage VDDarray for the DRAM of the this embodiment.

In the initial state of a read operation (time t0) each word line WL0, WL1, . . . is biased to 0V. The switch elements provided in the bit line pre-charge circuit BPC100 are in an on state, and the bit line pair BL, BLb are biased to pre-charge potential VBL by the bit line pre-charge circuit BPC100. The pre-charge potential VBL is set so as to be half the power supply potential SAVDD. Also, the switch elements SW102 and SW103 provided in the switch circuit TGS100 and the switch elements SW104 and SW105 provided in the amplifier circuit PCA100 are in the off state, while switch elements SW130 and SW131 provided in the main sense node pre-charge circuit MPC100 are in the on state. Further, a control signal supplied to the sense latch circuit SL100 is at 0V. As a result, the main sense node pair MS110 and MS111 are pre-charged to the pre-charge potential PCVDD, the pre-sense node pair PS100 and PS101 are pre-charged to the pre-charge potential VPSPC (>SAVDD/2), and the amplifier circuit PCA100 and the sense latch circuit SL100 are both put in the off state. The pre-charge potential VPSPC is PCVDD−VTN (VTN:NMOS transistor threshold potential) when the switch elements SW104 and SW105 are formed of NMOS transistors.

Next, the activation sequence of the array section A100 and the sense circuit section SS100 will be described. At time t1, if an address signal is input from the outside, the array section A100 will be selected as one array section, and the switch elements SW110 and SW111 provided in the corresponding first bit line pre-charge circuit BPC100, and the switch elements SW130 and SW131 provided in main sense node pre-charge circuit MPC100 will be put in the off state.

At time t2, word line WL0 based on the input address is driven to potential VPP (>power supply potential VDD+ threshold potential VTN) and read potential difference ΔV is generated between the bit line pair BL, BLb and the pre-sense pair PS100, PS101. FIG. 3 shows the operation when data "1" is stored in memory cell MC. The potential of bit line BL becomes read potential difference ΔV+SAVDD/2, while the potential of bit line BLb becomes SAVDD/2.

At time t3, the pre-amplifier section PSA100 is activated and the pre-sense operation commences. Switch elements SW102 and SW103 provided in the switch circuit TGS100 are put in the on state and a potential difference between the bit line pair BL, BLb is transmitted to the pre-sense node pair PS100 and PS101.

Generally, from the relationship of the number of connected elements, the capacitance of the pre-sense nodes can be sufficiently small compared to the capacitance of the bit lines. Because of this, the potential of the pre-sense node pair PA100 and PS101 is almost the same as the potential of the corresponding bit lines BL, BLb. The potential VPS of the pre-sense node PS100 is lowered from the pre-charge potential VPSPC to +SAVDD/2, and the potential VPSb of the pre-sense node PS101 is rapidly lowered from pre-charge potential VPSPC to SAVDD/2.

If the potentials VSP and VSPb of the pre-sense nodes PS100 and PS101 start to lower, the NMOS transistors N100 and N101 provided in the amplifier circuit PCA100 are put in the on state. At this time, the voltage across the gate and source of the NMOS transistors N100 and N101 approaches PCVDD−SAVDD (>>VTN) which means that the on resistance also becomes sufficiently small.

Also, NMOS transistor N101 connected to pre-sense node PS101 that is at a low potential compared to the pre-sense node PS100 is put in the on state first of all, and current flowing in NMOS transistor N101 is larger than the current flowing in the NMOS transistor N100. As a result, the potential of the input/output terminal Pout of the pre-amplifier section PSA100, namely the potential of the main sense node MS110, hardly changes and so the potential of the input output terminal Poutb, namely the potential of the main sense node MS111 falls rapidly to the potential of the pre-sense node PS101.

As has been described above, electric charge is transferred from the main sense nodes MS110 and MS111 through the pre-sense node pair PS100, PS101 to the bit line pair BL, BLb, and the potential of the pre-sense node pair PS100, PS101 and the bit line pair BL, BLb starts to rise. The total capacitance of the pre-sense node pair PS100, PS101 and the bit line pair BL, BLb (since the capacitance of the bit line pair BL, BLb is sufficiently large compared to the capacitance of the pre sense node pair PS100, PS101, the total of these capacitances can be considered to be substantially the same as the capacitance CB of the bit line pair BL, BLb) is sufficiently large compared to the capacitance of the main sense node pair PS100, PS101, which means that the extent by which the potential of the pre-sense node pair PS100, PS101 and the bit line pair BL, BLb rises becomes smaller than the extent by which the potential of the main sense node pair MS110, MS111 falls.

Since the extent to which the potential of the pre-sense node PS100 connected to the NMOS transistor N101 rises becomes small and the lowering of the potential of the input/output terminal Pout connected to the gate of NMOS transistor N101 is also slight, the on resistance of the NMOS transistor N101 does not change greatly. As a result, the potential of the input/output terminal Poutb (the potential of the main sense node MS111) continues to be lowered until it is the same as the potential of the pre-sense node PS101. On the other hand, since the extent by which the potential of the pre-sense node PS100 connected to the NMOS transistor N100 rises is small and the potential of the input/output terminal Poutb connected to the gate of the NMOS. transistor N100 falls rapidly, the on resistance of this NMOS transistor N100 rapidly becomes large and the transistor is put in the on state. As a result, the potential of the input/output terminal Pout (the potential of the main sense node MS110) is held at a high value. An amplified read potential difference $\Delta VSA$ (>>$\Delta V$) is then obtained for the main sense node pair MS110 and MS111, and the pre-sense operation is completed.

At this time, the NMOS transistor N101 is held in the on state and the potential of the input/output terminal Pout becomes a high state more than the sum of the potential of the pre-sense node PS101 and the threshold potential VTN. This causes the read potential difference $\Delta VSA$ to be higher than the threshold potential VTN ($\Delta VSA$>VTN).

As has been described above, according to the DRAM100 of the first embodiment, it is possible to amplify and transmit a read potential difference DV occurring on the bit line pair BL and BLb to the main amplifier section MSA100 before charging and discharging, which is accompanied by large amounts of noise, by controlling the on/off state of switch elements provided inside the DRAM, without supplying a potential adjusted with high precision.

Also, with the DRAM100 of the first embodiment, at the time the pre-sense operation commences the on resistance of the NMOS transistors N100 and N101 provided in the amplifier circuit PCA100 becomes small, and an initial difference part of the drain current of each of these transistors N100 and N101 is respectively positively fed back to the gate of the other and the operation is speeded up, which means that it is possible to complete the pre-sense operation within a few ns. Because of the positive feedback operation of the NMOS transistors N100 and N101 it is possible to obtain a large read potential difference $\Delta VSA$ without setting a pre-charge potential PCVDD of the main sense node pair MS110 and MS111 to a particularly high potential. Also, the potential on a high potential side node of the main sense node pair MS110 and MS111 is set to PCVDD−$\delta v$ and a potential of a low potential side node is set to PCVDD−$\Delta VSA$−$\delta v$ ($\delta v$>>$\Delta VSA$).

At time t4, the main amplifier section MSA100 is activated. That is, a control signal SNG supplied to the sense latch circuit SL100 is made a high potential (for example, the power supply potential SAVDD) and the sense operation is commenced by the NMOS transistors N120, N121 provided in the sense latch circuit SL100. As a result of this, the potential of whichever one of the main sense node pair MS110 and MS111 is at the lower potential is lowered still further. If this potential reaches a level less than SAVDD−VTP (VTP: absolute Value of PMOS transistor threshold potential) the PMOS transistors P120 and P121 provided in the sense latch circuit SL100 also function as a sense latch, and the node on the high potential side (MS110) is pulled up to power supply potential SAVDD. Also, since the potential of the high potential side node (MS110) is higher than the threshold potential VTN, by just the low potential side node (MS111), current flows from the low potential side bit line BLb to the sense latch circuit SL100 through the NMOS transistor N121, and the electric charge of the bit line BLb is discharged to the power supply potential VSS (=0V). Accordingly, the polarity of current of the MOS transistor N121 for the sense operation is reversed compared to at the time of the pre-sense operation.

At time t6, the switch elements SW104 and SW105 provided in the pre-amplifier section PSA100 are put in the on state. As Go a result, current flows from the sense latch circuit SL100 through the switch element SW104 to the high potential side bit line BL, and charge of the bit line BL is discharged to the power supply potential SAVDD. Data is then restored in the memory cell MC and the array operating voltage VDDarray becomes equal to the power supply potential SAVDD.

Next, the write operation of the FRAM100 of the first embodiment will be described.

For the write operation, fixed write data is previously applied to data bus DB. At time t6, column line CL is set to a high potential (VDD) and data on the data bus DB is sent to the sense latch circuit SL100. At this time, if the write data is different from the data retained by the sense latch circuit SL100 the state of the sense latch circuit SL100, namely the potential of the main sense node pair MS110, MS111, is reversed, as shown in FIG. 3. The data of the sense latch circuit SL100 is transmitted to the bit line pair BL, BLb via the switch elements SW104 and SW105 provided in the pre-amplifier section PSA100, and the write to the memory cell is completed. After completion of data transfer the column line CL is returned to a low potential (=0V).

Next, the operation of deactivating the array section A100 and the sense circuit section SS100 will be described.

At time t7, the word line WL0 is deactivated.

At time t8, the switch elements SW102 ands SW 103 provided in the first bit line pre-charge circuit BPC100 are turned off, and control signal SLNG is set to 0V, with the result that the sense latch circuit SL100 becomes deactivated.

At time t9, the switch elements SW110 and SW111 provided in the first bit line pre-charge circuit BPC100 and the switch elements SW130 and SW131 provided on the main sense node pre-charge circuit MPC100 are turned on, the bit line pair BL, BLb are pre-charged to SAVDD/2 and the main sense node pair MS100 and MS111 are pre-charged to pre-charge potential PCVDD. As a result, the pre-sense node pair PS100 and PS101 are pre-charged to a fixed potential. This potential to which the pre-sense node pair are pre-charged becomes VPP−VTN, because the switch elements SW104 and SW105 are NMOS transistors. However, if SAVDD>VPP−VTN the potential is power supply potential SAVDD, After that, the switch elements SW104 and SW105 provided in the pre-amplifier section PSA100 are turned off, and each node of the DRAM100 is pre-charged to the same potential as the initial state. The timing at which the first bit line pre-charge circuit BPC100 is turned on is preferably on or after time t8, for example, before time t9.

As described above, with the DRAM100 of the first embodiment of the present invention, the bit line pair BL, BLb are pre-charged to half the array operation voltage VDDarray, and after that noise generated at the time of the sense operation can be suppressed because there is charge and discharge of the relevant bit line pair BL, BLb.

A pre-sense operation is carried out before discharge of the bit line pair BL, BLb accompanying the generation of noise, and a read potential difference $\Delta V$ of the bit line pair BL, BLb is amplified, and so a reliable sense operation is realized even if the read potential difference $\Delta V$ is low. Moreover, since the generation of noise is suppressed, as described above, the array operation voltage VDDarray can be made lower.

Also, when the pre-sense operation has been completed the high potential side node of the main sense node pair MS110 and MS111 is set to PCVDD−, and the low potential side node is set to PCVDD−$\Delta$VSA−$\delta v$<<$\Delta$VSA). That is, an amplified read potential difference $\Delta$VSA is output to the main sense node pair MS110 and MS111. Accordingly, by setting the pre-charge potential PCVDD high compared to the power supply potential SAVDD it is possible to reduce the power supply potential SAVDD while allowing the operating conditions of the sense latch circuit SL100 to be satisfied as PCVDD−$\delta v$>PCVDD−$\Delta$VSA−$\delta v$>VTN.

Further, according to the DRAM100 of the first embodiment of the present invention it is possible to realize a pre-sense operation by merely controlling the on/off operation of the switch elements SW102 and SW103 provided in the switch circuit TGS100. That is, reliable operation of the pre-amplifier section PSA100 is realized, even when there are manufacturing variations, without supplying a potential that has been adjusted with high precision.

The on resistance of the MNOS transistors N100 and N101 constituting the amplifier circuit PCA100 is small, and these NMOS transistors N100 and N101 are arranged so that supply positive feedback to each other. This means that the pre-sense operation of the DRAM100 is completed within a few ns.

Also, since positive feedback amplification is carried out by the NMOS transistors N100 and N101, as described above, it is possible to obtain a high read potential difference $\Delta$VSA without setting a pre-charge potential PCVDD for the main sense node pair MS110 and MS111 to a particularly high value.

The main sense node pair MS110 and MS111 connected to the sense latch circuit SL100 including the NMOS transistors N120 and N121 and the PMOS transistors P120 and P121 is provided with a sufficient potential difference once the pre-sense operation has been completed. As a result, there is no need to make the timing at which one of the transistor pairs (for example PMOS transistors P120 and P121) is activated earlier than the activation of the other transistor pair (for example NMOS transistors N120 and N121). According to the DRAM100 of the embodiment of the present invention, PMOS transistors P120 and P121 are naturally activated in response to lowering of the potential of the main sense node pair MS110 and MS111. Accordingly, it is possible to suppress imbalance in charging current and discharging current between the sense latch circuit SL100 and the power supply potential SAVDD at the time of commencing the main sense operation.

Figure 4:
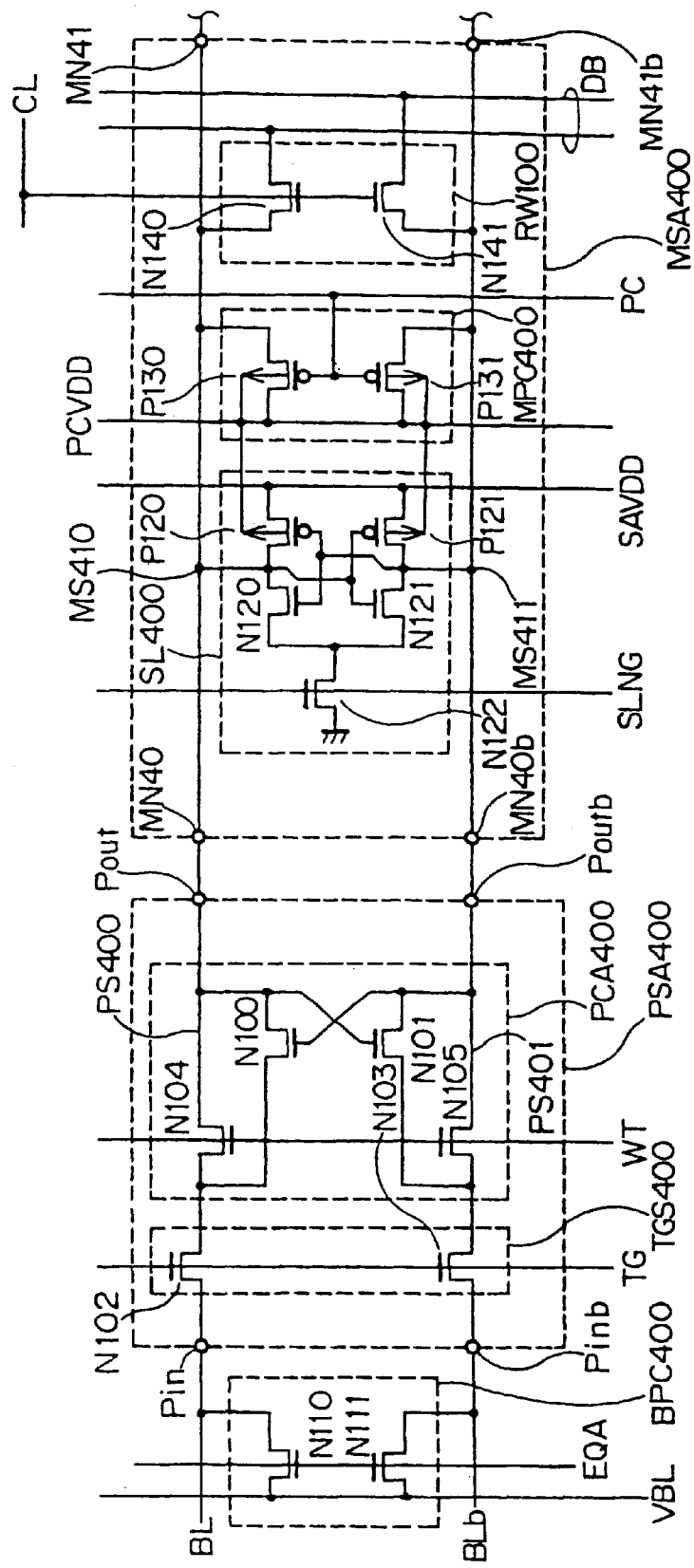
FIG. 4 is a circuit diagram shown the structure of a DRAM of a second embodiment of the present invention.

A DRAM of a second embodiment of the present invention will now be described. Compared to the DRAM of the first embodiment, in the DRAM of this second embodiment the sense circuit section SS100 is replaced by the sense circuit section SS400. The structure of this sense circuit section SS400 is shown in FIG. 4.

The sense circuit section SS400 connected to the bit line pair BL, BLb comprises a bit line pre-charge circuit BPC400 for pre-charging the bit line pair BL, BLb to pre-charge potential VBL, a pre-amplifier section PSA400 for partially amplifying a potential difference of the bit line pair BL, BLb and transferring it to a main amplifier section MSA400, and the main amplifier section MSA400 for further amplifying the potential difference amplified by the pre-amplifier section PSA400.

This bit line pre-charge circuit BPC400 comprises NMOS transistors N110 and N111 as third and fourth transistors, corresponding to the first bit line pre-charge circuit BPC100 constituting the DRAM100 of the first embodiment. The NMOS transistor N110 of the bit line pre-charge circuit BPC400 corresponds to the switch element SW110 of the first bit line pre-charge circuit BPC100, while the NMOS transistor N111 corresponds to the switch element SW111. Gates of these NMOS transistors N110 and N111 are connected to a supply line of a control signal EQA.

A pair of input/output terminals Pin and Pinb connected to the bit line pair BL, BLb, and a pair of input/output terminals Pout, Poutb connected to the main amplifier section MSA400 are provided in the pre-amplifier section PSA400.

Switching circuit TGS400 is provided between the input/output terminal pair Pin, Pinb and a pre-sense node pair PS400, PS401, and an amplifier circuit PCA400 is provided between the pre-sense node pair PS400, PS401 and the input/output terminal pair Pout, Poutb.

The switching circuit TGS400 comprises NMOS transistors N102, N103, corresponding to the switching circuit TGS100 constituting the DRAM100 of the first embodiment. The NMOS transistor N102 of the switching circuit TGS400 corresponds to the switch element SW102 of the switch circuit TGS100, while the NMOS transistor N103 corresponds to the switch element SW103. The gates of these NMOS transistors N102 and N103 are connected to a supply line of a control signal TG.

The amplifier circuit PCA400 corresponds to the amplifier circuit PCA100 constituting the DRAM100 of the first embodiment, and comprises NMOS transistors N100, N101, N104 and N105. The NMOS transistor N104 of the amplifier circuit section PCA100 corresponds to the switch element SW104 of the amplifier circuit PCA100, and NMOS transistor N105 corresponds to the switch element SW105. The gates of these NMOS transistors N104 and N105 are connected to a supply line of a control signal WT.

The main amplifier section MSA400 is provided with a pair of input/output terminals MN40, MN40b connected to the input/output terminal pair Pout, Poutb of the pre-amplifier section PSA400. The input output terminal MN40 connected in a feed through manner to the input/output terminal MN41 via main sense node MS410, while the input/output terminal MN40b is connected in a feed through manner to input/output terminal MN41b via main sense node MS411.

A sense latch circuit SL400, main sense node pre-charge circuit MPC400, and a data transfer circuit RW100 are connected in parallel between the main sense node pair MS410 and MS411.

The main sense node pre-charge circuit MPC400 is equivalent to the main sense node pre-charge circuit MPC100 constituting the DRAM100 of the first embodiment, and comprises PMOS transistors P130 and P131. The PMOS transistor P130 of the main sense node pre-charge circuit MPC400 corresponds to the switch element SW130 of the main sense node pre-charge circuit MPC100, while the PMOS transistor P131 corresponds to the switch element SW131. The gates of these PMOS transistors P130 and P131 are connected to a supply line of a control signal PC, and the substrate gate is connected to a supply line of pre-charge potential PCVDD.

The sense latch section SL400 corresponds to the sense latch SL100 constituting the DRAM100 of the first embodiment. Similarly to the sense latch circuit SL100, the sense latch section SL400 comprises PMOS transistors P120 and P121 and NMOS transistors N120, N121 and N122, and the circuit structure is also substantially the same. However, differing from the sense latch circuit SL100, the substrate gates of the PMOS transistors P120 and P121 provided in the sense latch circuit SL400 are connected to a supply line of the pre-charge potential PCVDD.

This pre-charge potential PCVDD is made a higher potential that the power supply potential SAVDD (PCVDD>>SAVDD). The data transfer circuit RW100 is also substantially the same as that provided in the DRAM100 of the first embodiment.

Figure 5:
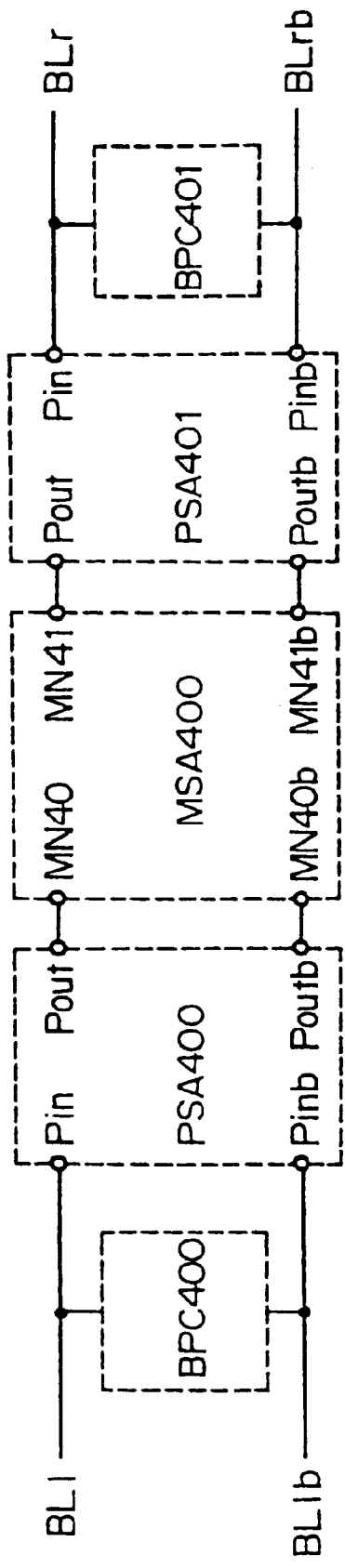
FIG. 5 is a block diagram for the case where the sense circuit shown in FIG. 4 is shared by a plurality of array sections.

Because of the circuit structure as shown in FIG. 5, the above described sense circuit section SS400 can allow part of the sense circuit section (the main amplifier section MSA400) to be shared by a plurality of adjacent of array sections. The circuit structure is substantially the same as the circuit structure allowing the main amplifier section MSA100 to be shared by adjacent array sections (not shown) in the DRAM100 of the first embodiment (refer to FIG. 2).

The sense circuit section in this case comprises a first bit line pre-charge circuit BPC400, a second bit line pre-charge circuit BPC401, a first pre-amplifier section PSA400, a second pre-amplifier section PSA401, and a main amplifier section MSA400. The first bit line pre-charge circuit BPC400 and the second bit line pre-charge circuit BPC401 have substantially the same internal circuitry. Similarly, the first pre-amplifier section PSA400 and the second pre-amplifier section PSA401 have substantially the same internal circuitry.

The bit line pair BL, BLb are connected to an input/output terminal pair of the first bit line pre-charge circuit BPC400 and an input/output terminal pair of the first pre-amplifier section PSA400. The input/output terminal pair Pout, Poutb of the first pre-amplifier section PSA400 are connected to the input/output terminal pair MN40, MN40b of the main amplifier section MSA400. The input/output terminal pair MN41, MN41b of the main amplifier section MSA400 are connected to the input/output terminal pair Pout, Poutb of the second preamplifier section PSA401. The input/output terminal pair Pin, Pinb of the second pre-amplifier section PSA401 are connected to an input/output terminal pair of the second bit line pre-charge circuit BPC401 and bit line pair BLr, BLrb. With this structure, one sense amplifier section is shared among adjacent array sections and a miniaturization of the DRAM is realized.

Also, since the first pre-amplifier section PSA400 and the second pre-amplifier section PSA401 are composed of the same type of transistors, for example, only NMOS transistors, the sense circuit section can be laid out in a small area, with the result that further miniaturization of the DRAM is possible.

Figure 6:
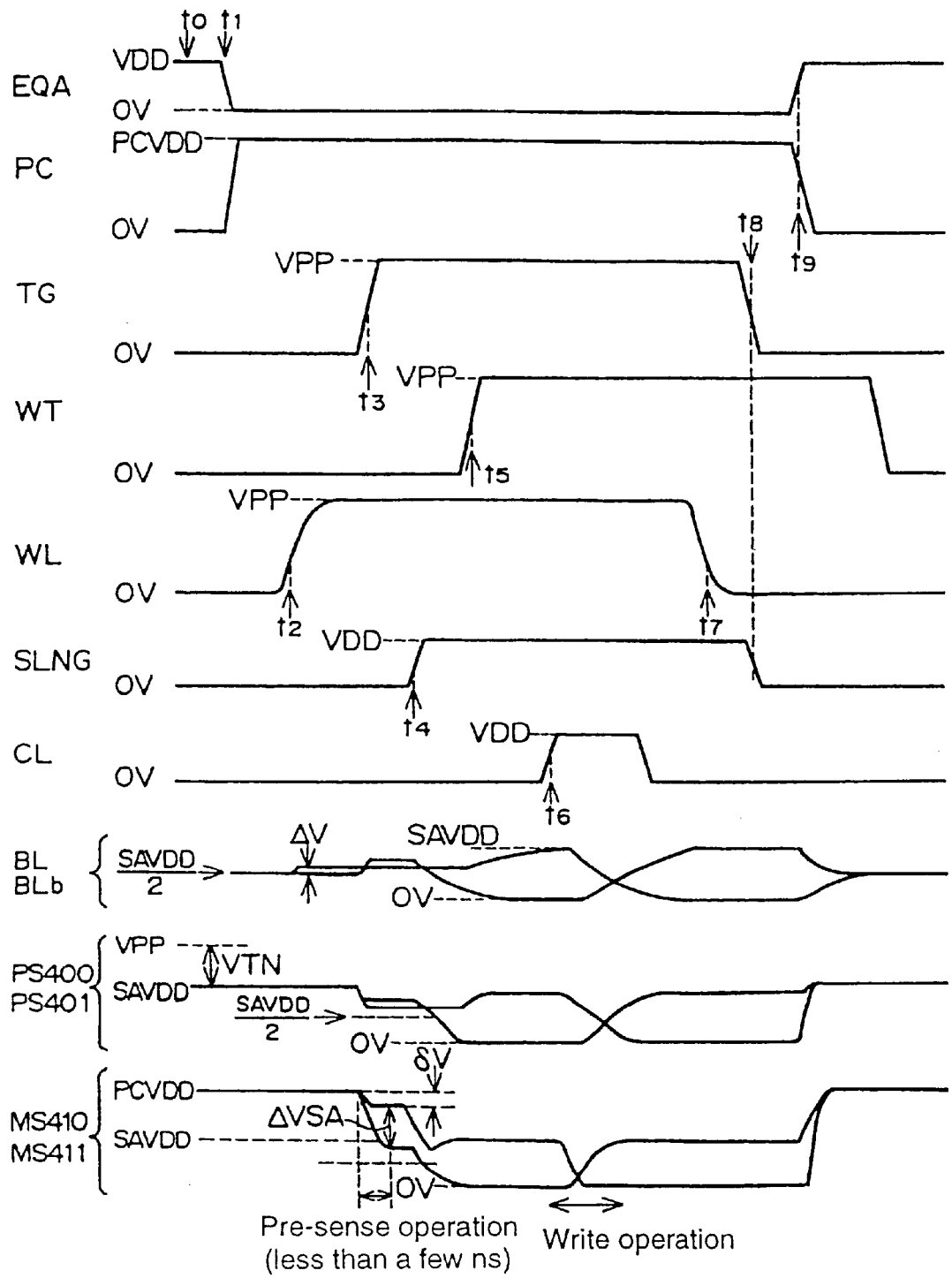
FIG. 6 is a timing chart for describing the operation of the DRAM shown in FIG. 2.

The operation of the DRAM having the above described structure will now be described using FIG. 6. FIG. 6 is a timing chart showing read operation and write operation of the DRAM of the second embodiment. The operation of the DRAM of the second embodiment of the second embodiment is basically the same as that of the DRAM100 of the first embodiment.

In the initial state of the read operation (time t0), control signal EQA is set to the power supply potential SAVDD and NMOS transistors N110 and N111 constituting the bit line pre-charge circuit BPC400 are turned off.

Control signal TG is set to the power supply potential VSS (=0V) and NMOS transistors N102 and N103 constituting the switch circuit TGS400 are turned on.

Control signal WT is set at the power supply potential VSS (=0V), and NMOS transistors provided in the amplifier circuit PCA400 are turned off.

Control signal PC is set at the power supply potential VSS (=0V) and PMOS transistors P130 and P131 constituting the main sense node pre-charge circuit MPC400 are turned on.

The sense latch circuit SL400 provided in the main amplifier section MSA400 is deactivated at time t0.

At time t1, control signal EQA is set to power supply potential VSS (=0V) and control signal PC is set to pre-charge potential PCVDD. As a result, the NMOS transistors N110 and N111 constituting the bit line pre-charge circuit BPC400 and PMOS transistors P130 and P131 constituting the main sense node pre-charge circuit MPC400 are turned off.

After the word line (not shown) has been activated at time t2, control signal TG is set to potential VPP (>SAVDD) at time t3, and the pre-sense operation is started. First of all, NMOS transistors N102 and N103 provided in the switch circuit TGS400 are turned on, and a potential difference between the bit line pair BL, BLb is transferred to the pre-sense node pair PS400 and PS401. This potential difference is amplified by a positive feedback operation of the NMOS transistors N100 and N101 provided in the amplifier circuit PCA400, and as a result a large read potential difference ΔVSA (>>ΔV) is obtained on the main sense node pair MS410 and MS411. The above described pre-sense operation is completed within a few nanoseconds.

At time t4, the main amplifier section MSA400 is activated. Then, at time t5, control signal WT is set to potential VPP and the NMOS transistors N104 and N105 provided in the pre-amplifier section PSA400 are turned on. As a result, the potential of the bit line pair BL, BLb is restored based on read data. The write operation is substantially the same as in the DRAM100 of the first embodiment.

Next, the operation of deactivating the array section (not shown) and the sense circuit section SS400 will be described.

At time t7, word line WL0 is deactivated.

At time t8, control signal TG is set to power supply potential VSS (=0V) and NMOS transistors N102 and N103 provided in the pre-amplifier section PSA400 are turned off. Control signal SLNG is then set to 0V and the main amplifier section MSA400 is deactivated.

At time t9, control signal EQA is set to power supply potential SAVDD and control signal PC is set to power supply potential VSS (=0V). This causes the NMOS transistors N110 and N111 constituting the bit line pre-charge circuit BPC400, and the PMOS transistors P130 and P131 constituting the main sense node pre-charge circuit MPC400, to be turned off, and the bit line pair BL, BLb, main sense node pair MS410 and MS411, and pre-sense node pair PS400 and PS401 are pre-charged. After that, control signal WT is set to power supply potential VSS (=0V) and the NMOS transistors N104 and N105 provided in the pre-amplifier section PSA400 are turned off.

As has been described above, according to the DRAM of the second embodiment of the present invention, similarly to the DRAM100 of the first embodiment, it is possible to design with a low array operation voltage VDDarray while maintaining high speed operation.

According to the DRAM of the second embodiment, as has been detailed above, with the structure shown in FIG. 5 it becomes possible to share one sense circuit among a plurality of adjacent array sections. However, the first pre-amplifier section PSA400 and the second pre-amplifier section PSA401 that are necessary for the adjacent array sections can be constructed using the same type of transistors, for example only MOS transistors. Accordingly it is possible to have a layout with narrow intervals between elements with the result that a further reduced surface area and a reduction in power consumption are realized.

Figure 7:
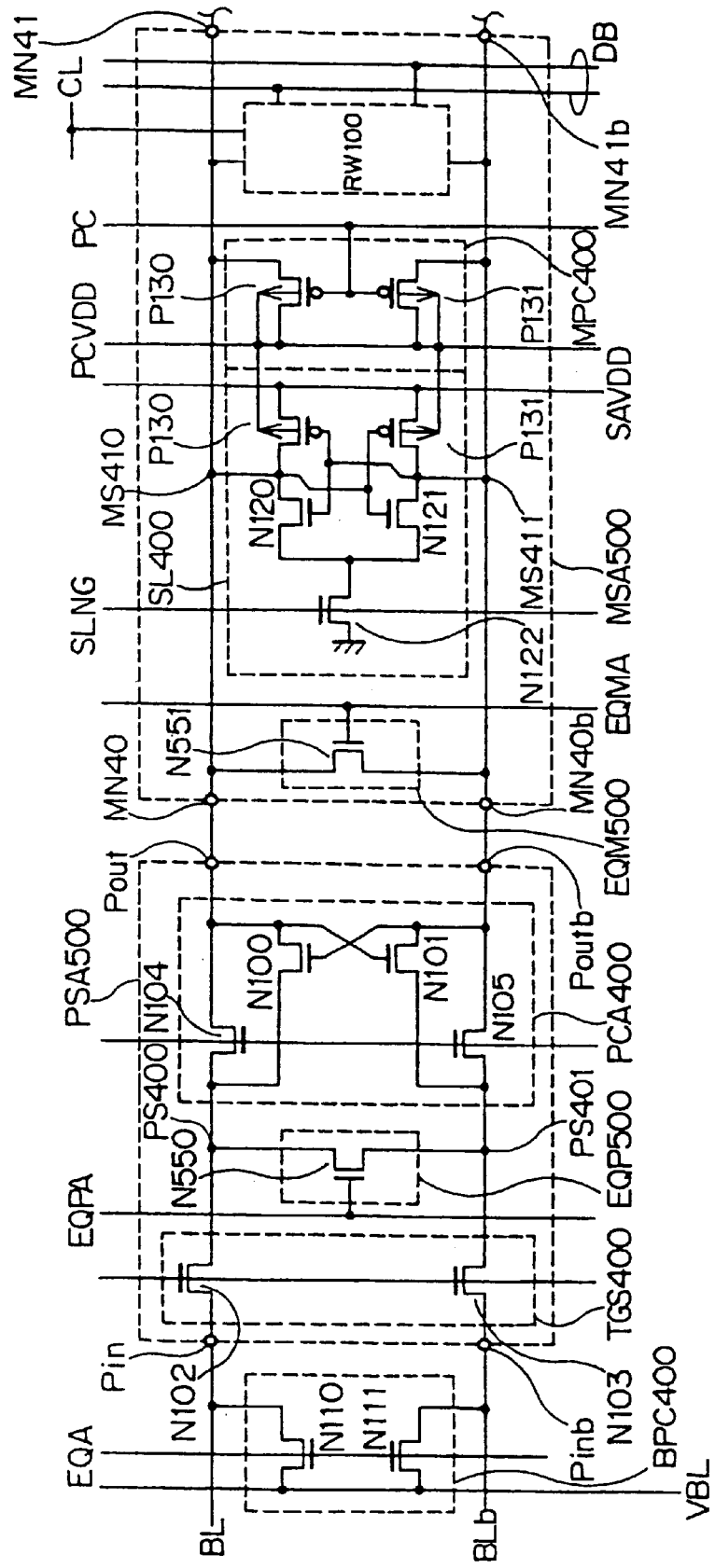
FIG. 7 is a circuit diagram shown the structure of a DRAM of a third embodiment of the present invention.

A DRAM of a third embodiment of the present invention will now be described. Compared to the DRAM of the second embodiment, the DRAM of the third embodiment has a sense circuit section SS500 in place of the sense circuit section SS400. The structure of the sense circuit section is shown in FIG. 7.

Compared to the sense circuit SS40, the sense circuit section SS500 has a pre-amplifier section PSA500 in place of the pre-amplifier section PSA400, and a main amplifier section MSA500 in place of the main amplifier section MSA400.

Compared to the pre-amplifier section PSA400, the preamplifier section PSA500 additionally has an equalizer circuit EQP500, while compared to the main amplifier section MSA400 the main amplifier section NSA500 additionally has an equalizer circuit EQM500.

The structure of the sense circuit section SS500 provided in the DRAM of the third embodiment will be described in detail below.

This sense circuit SS500 is comprised of a bit line pre-charge circuit BPC400 for pre-charging the bit line pair BL, BLb to the pre-charge potential VBL, a pre-amplifier section PSA500 for partially amplifying a potential difference of the bit line par BL, BLb and transferring the potential difference to a main amplifier section MSA500, and the main amplifier section NSA500 for further amplifying the potential difference that has been amplified by the pre-amplifier section PSA500.

As described above, the pre-amplifier section PSA500 is provided with the equalizer circuit EQP500 while the main amplifier section MSA500 is provided with the equalizer circuit EQM500. The equalizer circuit EQP500 comprises an N105 transistor N550 having a drain connected to a pre-sense node PS400, a source connected to a pre-sense node PS401 and a gate connected to a supply line of a control signal EQPA. The equalizer circuit EQM500 comprises an NMOS transistor N551 having a drain connected to a main sense node MS410, a source connected to a main sense node MS411 and a gate connected to a supply line of control signal EQMA.

Figure 8:
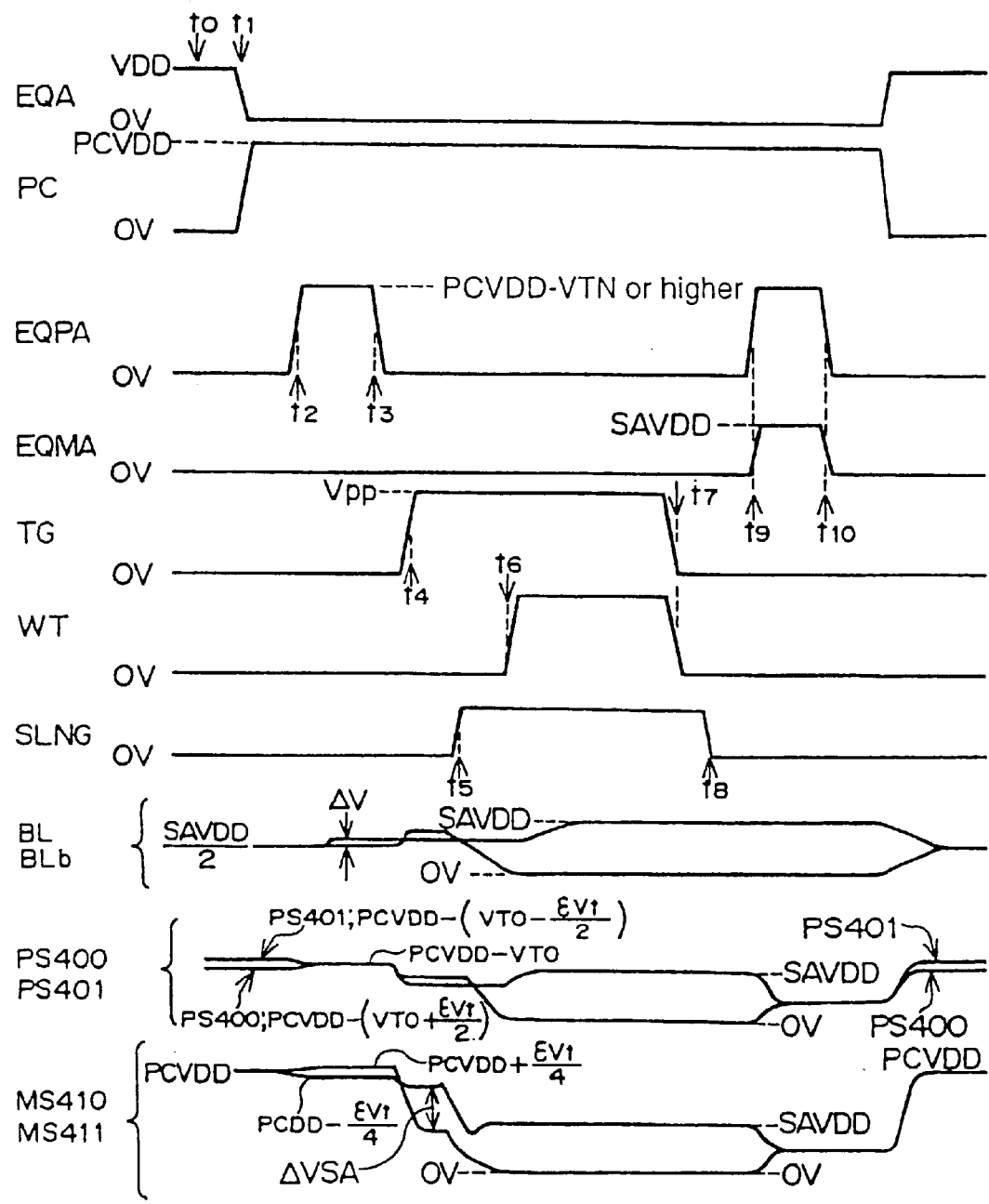
FIG. 8 is a timing chart for describing the operation of the DRAM shown in FIG. 7.

The operation of the DRAM of the third embodiment having the above described construction will be described using FIG. 8. FIG. 8 is a timing chart showing a read operation and a write operation of the DRAM of the third embodiment. The operation of the DRAM of the third embodiment is basically the same as the operation of the DRAM of the second embodiment. Description will now be given focusing on the points of difference between the operation of the third embodiment and the operation of the third embodiment.

In the initial state of the read operation (time t0), control signal EQA is set to power supply potential SAVDD while control signals TG, WT, PC, SLNG, EQPA and EQM are all set to power supply potential VSS (=0V). As a result, bit line pre-charge circuit BPC400 and main sense node pre-charge circuit MPC400 are turned on. Switch circuit TGS400 provided in the pre-amplifier section PSA500 and NMOS transistors N104 and N105 provided in the amplifier circuit PCA400 are turned off. Also, the sense latch circuit SL400 is deactivated and the equalizer circuits EQP500 and EQM500 are both turned off.

At time t1, control signal EQA is set to power supply potential VSS (=0V), and control signal PC is set to pre-charge potential PCVDD. This causes the bit line pre-charge circuit BPC400 and the main sense node pre-charge circuit MPC400 to both be turned off.

At time t2, control signal EQPA is set to a high potential (at least PCVDD−VTN). As a result, a difference ϵvt in threshold potential between transistors (hereinafter referred to as VT skew) caused by manufacturing variations in the NMOS transistors N100 and N101 provided in the pre-amplifier section PSA500 is reduced. The operation of reducing this VT skew (hereinafter referred to as a VT skew compensation operation) will be described in detail later.

At time t3, control signal EQPA is set to power supply potential VSS (=0V). During the VT skew compensation operation it is preferable to activate a fixed word line.

At the point in time where a read potential difference has been obtained on the bit line pair BL, BLb (time t4), control signal TG is set to potential VPP (>SAVDD) and the pre-sense operation commences.

At time t5, the main amplifier section MSA500 is activated. Then, at time t6, control signal WT is set to potential VPP and the NMOS transistors N104 and N105 provided in the pre-amplifier section PSA500 are turned on. As a result of this, the potential of the bit line pair BL, BLb is restored based on read data.

Next, the deactivation of the array section (not shown) and the sense circuit SS500 will be described.

At time t7, the word line is deactivated and control signals TG and WT are set to power supply potential VSS(=0V).

At time t8, control signal SLNG is set to 0V and the main amplifier section MSA500 is deactivated.

At time t9, control signals EQPA and EQMA are set to a high potential (higher than power supply potential SAVDD), and the pre-sense node pair PS400 and PS401, and the main sense node pair MS410 and MS411 are respectively equalized. The point of equalization is so that in the pre-charge operation after the pre-sense node pair PS400 and PS401 have been adjusted so as to be less than SAVDD, transfer of electric charge is carried out for the pre-sense node PS400 or the pre-sense node PS401.

At time t10, control signals EQPA and EQIA are set to power supply potential VSS (=0V). After that, control signal PC is set to power supply potential VSS (=0V) and the main sense node pre-charge circuit MPC400 is turned on. The main sense node pair MS410 and <S411 and the pre-sense node pair PD400 and PS401 are also pre-charged. The timing at which the bit line pre-charge circuit BPC400 is turned on is preferably later than time t7, for example, before time t8.

Next, the VT skew compensation operation will be described. Here, the threshold voltage VTN100 of an NMOS transistor N100 is assumed to be:

$$VTN100=VT0+\epsilon vt/2(V)$$

While the threshold voltage VTN101 of NMOS transistor N101 is assumed to be:

$$VTN101=VT0-\epsilon vt/2(V)$$

Thus, the VT skew becomes $$|VTN100-VTN101|=\epsilon vt\,(V)$$

In this case, the pre-sense node PS400 is pre-charged to:

$$PCVDD-(VT0+\epsilon vt/2)\,(V)$$

While the pre-sense node PS401 is pre-charged to:

$$PCVDD-(VT0-\epsilon vt/2)\,(V)$$

Also, the potentials of the main sense node MS410 and the main sense node MS411 are both set pre-charge potential PCVDD. Of control signal EQPA is set to power supply potential SAVDD and the VT skew compensation operation is commenced, the potential of each node is changed as described in the following.

The pre-sense node pair PS400 and PS401 are equalized, and the potential of both of these nodes is set to PCVDD–VT0 (V). At this time, transistors connected to the main sense node pair MS410 and MS411 are all turned off and the main sense node pair MS410 and MS411 are put into a high impedance state. The main sense node pair MS410 and MS411 are then subjected to the influence of variations in potential of the pre-sense node pair PS400 PS401 through the gate capacitance of the NMOS transistors N100 and N101. As a result the potential of the main sense node pair MS410 and MS411 is changed.

If the gate capacitance of both of the NMOS transistors N100 and N101 is Cg and the capacitance of both nodes of the main sense node pair MS410 and MS411 is CMSA, the potential of the main sense node pair MS410 and MS411 changes as described in the following.

With the potential of the pre-sense node PS400 rising by $\epsilon vt/2$ (V), the potential VM1 of the main sense node MS411 becomes:

$$VM1=PCVDD+\epsilon vtCg/2\{2(Cg+CMSA)\}\,(V)$$

On the other hand, with the potential of the pre-sense node PS401 falling by $\epsilon vt/2$ (V), the potential VM0 of the main sense node MS410 becomes:

$$VM0=PCVDD-\epsilon vtCg/2\{2(Cg+CMSA)\}\,(V)$$

In order to simplify the description, if it is assumed that Cg=CMSA then the potential VM1 of the main sense node MS411 and the potential VM0 of the main sense node MS410 respectively become:

$$VM1=PCVDD+\epsilon vt/4$$

$$VM0=PCVDD-\epsilon vt/4$$

At the point in time when the VT skew compensation operation has been completed the gate source voltage VGS100 of the NMOS transistor having a threshold potential higher by $\epsilon vt/2$ becomes:

$$VGS100=VT0+\epsilon vt/4$$

while gate source voltage VGS101 of the NMOS transistor having a threshold potential lower by $\epsilon vt/2$ becomes:

$$VGS101=VT0-\epsilon vt/4$$

Therefore, in order to make the gate source voltage VGS100 of the NMOS transistor N100 and the gate source voltage VGS101 of the NMOS transistor N101 in the case where the VT skew compensation operation is not carried out equal to the values when the VT skew operation is carried out, it is necessary for the threshold potential VTN100 of the NMOS transistor N100 to be:

$$VTN100=VT0+\epsilon vt/4\,(V)$$

and the threshold potential VTN101 of the NMOS transistor N101 to be:

$$VTN101=VT0-\epsilon vt/4\,(V)$$

That is, VT skew is effectively reduced to $\epsilon vt/2$ (V) by the VT skew compensation operation.

Further, the potential difference of the pre-sense node pair immediately after commencing the pre-sense operation is substantially the same as the read potential difference of the bit line pair BL, BLb. That is, in the DRAM of the third embodiment a condition of a read potential difference $\Delta V$ is that $\Delta V>\epsilon vt/2$, in order to prevent sensing errors. Accordingly, with the DRAM of the third embodiment a read operation is possible even with a read potential difference of half compared to a conventional DRAM, which means that a stable operation is realized even in the event of manufacturing variations and the occurrence of operation noise.

As has been described above, the DRAM of the third embodiment is configured with the main sense node pair MS410 and MS411 and the pre-sense node pair PS400 and PS401 being respectively connected to equalizers EQP500 and EQM500, but if the sense circuit section SS500 is deactivated the equalizer circuit EQM500 supports the operation of the equalizer circuit EQP500 and some structural elements can be omitted. If the equalizer circuit EQM500 is omitted, then for the equalization operation from time t8 to time t9 the pre-sense node pair PS400 and PS401 are equalized to a potential that is slightly lower than the potential SAVDD. Also, a low potential side node of the main sense node pair MS410 and MS411 rises to potential SAVDD/2 while a high potential side node is held at potential SAVDD/2. Potential variations of the main sense node pair MS410 and MS411 are caused by the fact that during the equalizing operation one of the NMOS transistors N100 and N101 is on while the other is off. After that, similarly to the case when the equalizer circuit EQM500 is provided, pre-charging is carried out on the main sense node pair MS410 and MS411 and the pre-sense node pair PS400 and PS401.

As has been described above, according to the DRAM of the third embodiment an equalizer circuit EQP500 is connected to the pre-sense node pair PS400 and PS401 and a VT skew compensation operation is carried out, which means that in addition to the effects of the DRAM of the first and second embodiments the following effects are also obtained.

Operation is possible without erroneous sensing, even with a small read potential difference $\Delta V$ of a bit line, for example, as small as half the VT skew between the NMOS transistor N100 and the NMOS transistor N101 provided in the pre-amplifier section PSA500. In other words, a stable operation is realized even if there is a large VT skew between the NMOS transistor N100 and the NMOS transistor N101 caused by manufacturing variations.

Also, since erroneous sensing is prevented even when a read potential difference $\Delta V$ is small, it is possible to reduce the power supply potential required for operation of the array section (not shown).

Still further, the VT skew compensating operation is realized by adding an equalizer circuit EQP500 formed of a single NMOS transistor N550. Accordingly, it is possible to absorb manufacturing variations that hinder stable operation while keeping the effects of element layout to a minimum.

Figure 9:
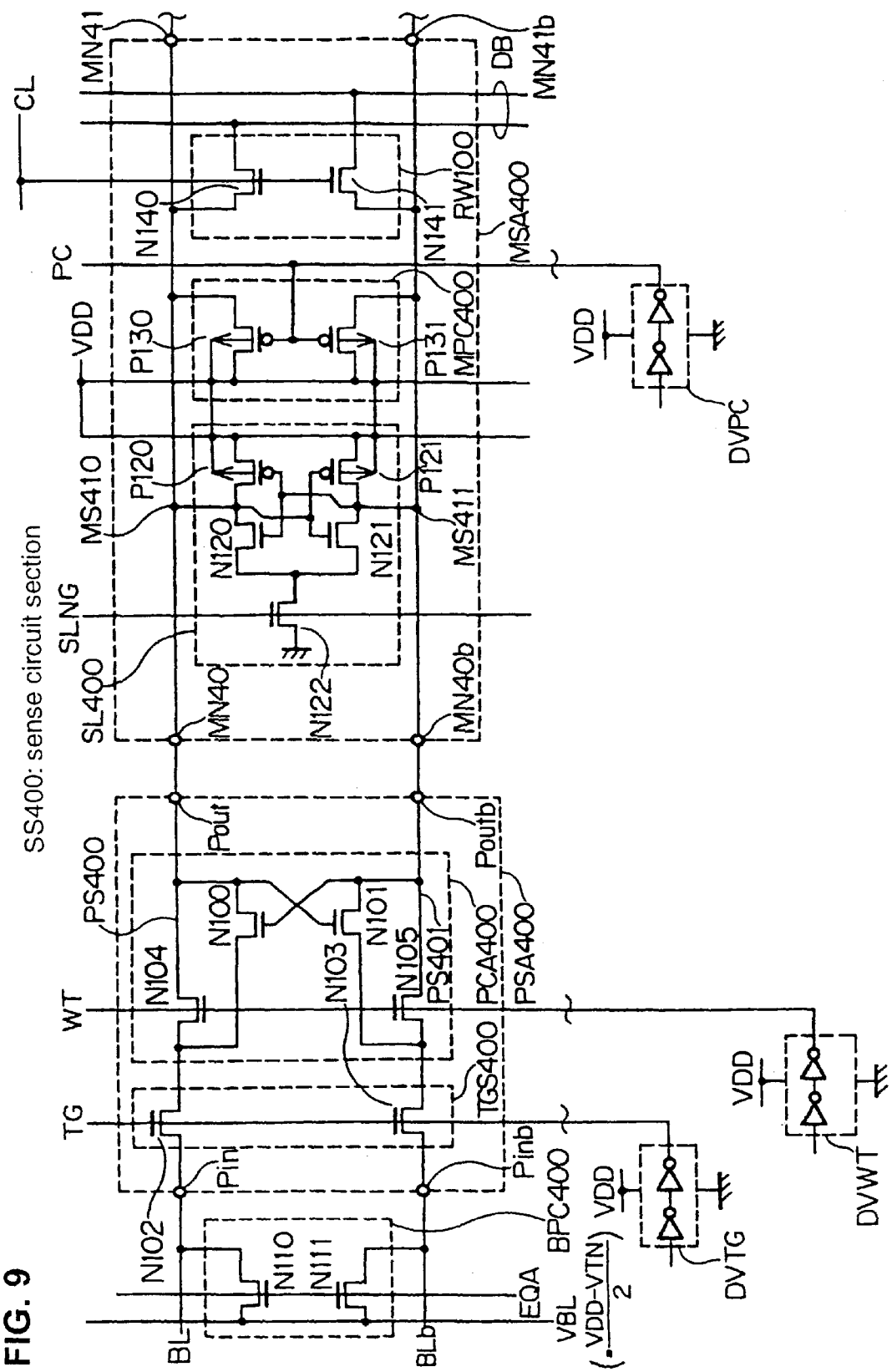
FIG. 9 is a circuit diagram shown the structure of a DRAM of a fourth embodiment of the present invention.

A DSRAM of a fourth embodiment of the present invention will now be described. As shown in FIG. 9, the DRAM of this fourth embodiment is provided with the sense circuit section SS400, similarly to the DRAM of the second embodiment, and is also provided with drivers DVGT, DVWT and DVPC connected to the sense circuit section SS400.

The external connection capacity of the sense circuit section SS400 constituting the DRAM of the fourth embodiment is different from that of the DRAM of the second embodiment in the following respect.

First of all, with respect to the main amplifier section MSA400, the source and substrate gate of PMOS transistors P130 and P131 provided in the main sense node pre-charge circuit MPC400, and the source and substrate gate of the PMOS transistors provided in the sense latch circuit SL400 are connected to power supply potential VDD.

The supply lines of each of the control signals TG, WT and PC are connected to drivers DVTG, DVWT and DVPC, with the result that the control signals TG, WT and PC vary between power supply potential VDD and 0V.

Each word line (not shown) is driven by a fixed driver varying between power supply potential VDD and 0V. Also, the pre-charge potential VBL is set so as to be equal to (VDD−VTN)/2.

The operation of the DRAM of the fourth embodiment having the above described structure will now be described using FIG. 6 showing the operation of the DRAM of the second embodiment. The operation of the DRAM of the fourth embodiment will be described with pre-charge potential PCVDD and potential VPP replaced by power supply potential VDD and potential VDD/2 replaced by potential (VDD−VTN)/2 in FIG. 6.

First of all, description will be given of the array operation voltage VDDarray of the DRAM of the fourth embodiment. With the main amplifier section MSA400 in an activated state, the high potential side node of the main sense node pair MS410 and MS411 is set to power supply potential VDD while the low potential side node is set to 0V. Each potential is supplied to the bit line pair BL, BLb through the NMOS transistors N102 and N104 and the NMOS transistors N103 and N105 provided in the pre-amplifier section PSA400. At this time, each of the gates of the NMOS transistors are set to power supply potential VDD. Accordingly, the bit line to be set to a low potential is lowered to 0V, but the bit line to be set to a high potential is only raised to potential VDD−VTN, with the result that the array operating voltage VDDarray is set to VDD−VTN (V).

After that, when the array section (not shown) is deactivated, since the bit line pair BL, BLb are equalized the pre-charge potential of the bit line pair BL, BLb is set to (VDD−VTN)/2 (V). Also, the pre-charge voltage of the main sense node pair MS410 and MS411 is set to VDD (V) while the pre-charge voltage of the pre-sense node pair PS400 and PS401 is set to VDD−VTN (V).

In order to commence the pre-sense operation, it is necessary to turn on the NMOS transistors N100 and N101 provided in the pre-amplifier section PSA400. If the read potential difference of the bit line pair BL, BLb is set to $\Delta V$ the potential of the bit lines BL and BLb at the time of commencing the pre-sense operation will be lowered to $\Delta V + (VDD-VTN)/2$ (V). As a result, with the DRAM of the fourth embodiment, in order to carry out the pre-sense operation in a stable manner the threshold potential VTN of the NMOS transistors N100 and N101 preferably satisfies $$VTN < VDD - (\Delta V + (VDD-VTN)/2)$$

namely, $VTN < VDD - 2\Delta V$

This condition can be achieved in the normal manufacture of a semiconductor device, and there is no need to introduce a special design means or manufacturing step.

In order to allow the pre-sense to be totally completed, it is preferable for the threshold potential VTN of the NMOS transistors N100 and N101 to satisfy $$VDD - \delta v > VTN + (VDD-VTN)/2$$

namely, $VTN < VDD - 2\delta v$
where $\delta v$ is the potential by which the high potential side node of the main sense node pair MS410 and MS411 is lowered.

As described above, discharge from a high potential side node of the main sense node pair MS410 and MS411 to a corresponding pre-sense node is rapidly prevented by lowering the potential of the low potential side node. Accordingly, with the DRAM of the fourth embodiment, it is possible to design a small potential reduction $\delta v$, and it is possible to easily satisfy the condition $$VTN < VDD - 2\delta v$$

As described above, according to the DRAM of the fourth embodiment, the following effects can be obtained in addition to the effects of the DRAM of the first, second and third embodiments.

Since the pre-amplifier section PSA400 is provided, no problem arises due to the pre-charge potential of the bit line pair BL and BLb and the pre-charge potential of each of the sense nodes not being matched, and it is possible to set the array operation voltage VDDarray low compared to the pre-charge potential of the main sense node pair MS410 and MS411. Specifically, it becomes possible to set the pre-charge potential of the bit line pair BL, BLb lower than the half of the power supply potential VDD of the sense latch circuit SL400. Accordingly, it becomes possible to remove individual step-up circuits that are required in the related art, and it is possible to realize miniaturization of the circuit and reduced power consumption.

Further, since the pre-charge potential of the bit line pair BL, BLb can be obtained by equalization, there is no noise caused by imbalance between charge and discharge of the bit line pair BL, BLb and a stable DRAM operation is realized.

The sense circuit sections SS100, SS400 and SS500 provided in the DRAM of the above described first, second, third and fourth embodiments will now be described using FIG. 10. Here, description will be given using pre-amplifier section PSA500 constituting the sense circuit SS500 provided in the DRAM of the third embodiment as a representative example.

Figure 10:
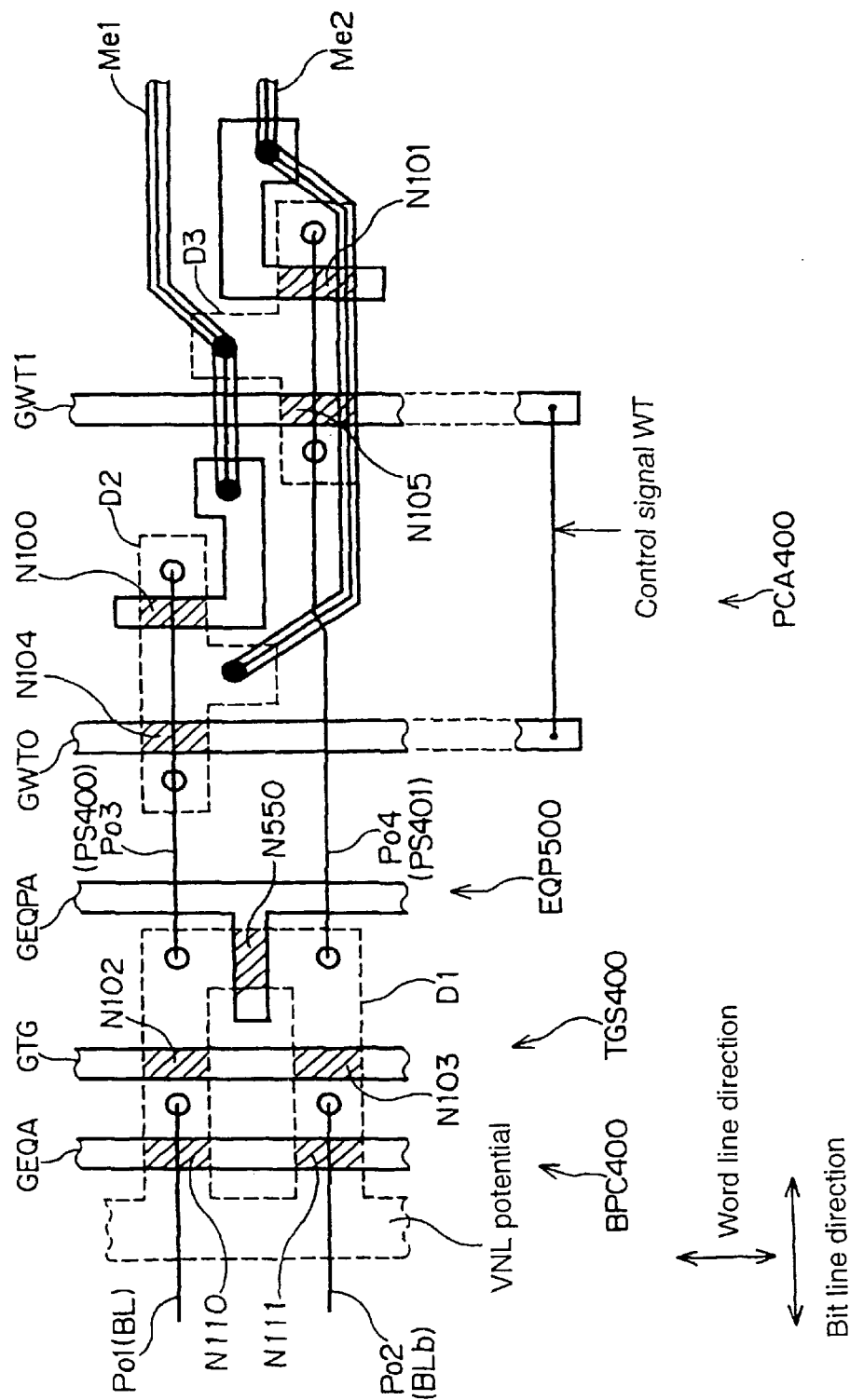
FIG. 10 is a plan view for describing the layout of the DRAM of a fifth embodiment of the present invention.

In FIG. 10, sections enclosed within dotted lines represent impurity diffusion regions, white circles represent points of connection between first wiring layers and the impurity diffusion regions, and black circles represent points of connection between a second wiring layer and the impurity diffusion regions or gate electrodes.

The bit line pre-charge circuit BPC400 is connected to a cell array section (not shown) via the bit line pair BL, BLb formed using first wiring layers Po1 and Po2. Word lines (not shown) are arranged so as to cross the bit line pair BL, BLb (refer to FIG. 1).

The NMOS transistors N110 and N111 provided in the bit line pre-charge circuit BPC400 comprise gate electrodes GEQA formed in the direction of the impurity diffusion region D1 and the word lines (vertically in the drawing).

The NMOS transistors N102 and N103 constituting the switch circuit TGS400 provided in the pre-amplifier section PSA400 comprise gate electrodes GTG formed in the direction of the impurity diffusion region D1 and the word lines.

The NMOS transistor N550 constituting the equalizer circuit EQP500 comprises a gate electrode GEQPA formed in the direction of the impurity diffusion region D1 and the word lines.

The amplifier circuit PCA400 provided in the pre-amplifier section PSA500 has a pattern layout as described in the following.

NMOS transistor N100 and NMOS transistor N104 connected in parallel with this NMOS transistor N100 are formed in impurity diffusion region D2 as a T-shaped first impurity diffusion region. NMOS transistor N101 cross connected to NMOS transistor N100 and NMOS transistor N105 connected in parallel with the NMOS transistor N101 are formed in impurity diffusion region D3 as a T-shaped second impurity diffusion region.

The gate of NMOS transistor N104 is connected to gate electrode GWT0 being one control signal supply line formed in the word line direction, and the gate of NMOS transistor N105 is connected to gate electrode GWT1 being another control signal supply line formed in the same word line direction.

The DRAM normally has a plurality of sense circuit sections including a pre-amplifier section PSA500, and each sense circuit section is repeatedly arranged in the word line direction. Each sense circuit is supplied with a specified signal and potential through a plurality of electrode formed in the word line direction.

As shown in FIG. 10, part of the impurity diffusion region D1 extends in the word line direction, and the impurity diffusion region D1 that is provided in each pre-amplifier section PSA500 is set to the pre-charge potential VBL.

The gate electrode GEQA extending in the word line direction is supplied with control signal EQA, electrode GTG is supplied with control signal TG and gate electrode GEQPA is supplied with control signal EQPA. Gate electrode GWT0 and gate electrode GWT1 are outside the wiring of the sense circuit section and are supplied with control signal WT.

Next, the internal connections of the pre-amplifier section PSA500 will be described.

Bit line BL formed from a first wiring layer Po1 is connected to common portions of NMOS transistor N110 and NMOS transistor N102 formed in the impurity diffusion region D1, while bit line BLb formed from a first wiring layer Po2 is connected to common portions of NMOS transistor N111 and NMOS transistor N103 formed in the impurity diffusion region D1.

Common portions of NMOS transistor N102 and NMOS transistor N550 formed in the impurity diffusion region D1, as well as the source of NMOS transistor N104 and the source of NMOS transistor N100 formed in impurity diffusion region D2, are connected to pre-sense node PS400 formed from first wiring layer Po3.

Common portions of NMOS transistor N103 and NMOS transistor N550 formed in the impurity diffusion region D1, as well as the source of NMOS transistor N105 and the source of NMOS transistor N101 formed in impurity diffusion region D2, are connected to pre-sense node PS401 formed from first wiring layer Po4.

Main sense node MS410 formed from second wiring layer tel is connected to the gate of NMOS transistor N100 formed in the impurity diffusion region D2, as well as to common portions of NMOS transistor N105 and NMOS transistor N101 formed in impurity diffusion region D3. The second wiring layer Me1 extends to the main amplifier section MSA400 (not shown).

Main sense node MS411 formed from second wiring layer Me2 is connected to shared portions of NMOS transistor N104 and NMOS transistor N100 formed in the impurity diffusion region D2, as well as to the gate of NMOS transistor N 101 formed in impurity diffusion region D3. The second wiring layer Me2 extends to the main amplifier section MSA400, similarly to the second wiring layer Me1.

As has been described above, the NMOS transistors N100, N101, N104 and N105 constituting the amplifier circuit provided in the pre-amplifier section PSA500 are arranged in two separated impurity diffusion regions D2 and D3. Each of the NMOS transistors N100, N101, N104 and N105 is constructed so as to be commonly provided with control signal WT from two gate electrodes GWT0 and GWT1. Also, as shown in FIG. 10, the number of wires formed in the bit line directions is two for each of the first wiring layers Po1, Po2, Po3, Po4 and second wiring layers Me1 and Me2 of the sense circuit SS500. That is, the number of wires becomes equal to the number of wires of the bit line pairs BL, BLb connected to each sense circuit section. Points of connection between each wire and each element are also set at up to two on the same straight line in the word line direction. Accordingly, the DRAM of the fifth embodiment is formed at the same wiring density an the DRAM of the related art, and manufacture is possible without a fine patterning process etc. and without special processing.

A preferred embodiment of the present has been described above with reference to the attached drawings, but the present invention is not limited to these examples. Various modifications and alterations will be evident to one skilled in the art, and the appended claims are intended to cover all such modifications without departing from the spirit and scope of the present invention.

The array section is not limited to the array section A100 shown in FIG. 1, and it is possible to have such a structure that a read potential difference is supplied from one of the pair of input/output terminals Pin and Pinb provided in the sense circuit sections SS11, SS400 and SS500, with a reference potential being supplied from the other. For example, it is possible to have array section with memory cells MC connected to NAND gates.

Also, the first bit line pre-charge circuit BPC100 can have a structure including equalizing transistors.

Further, the present invention is applicable to cases where various potentials are set as described in the following. pre-charge potential PCVDD and potential VPP can be generated so as to be equal by being raised from externally inputted potential EVDD (PCVDD=VPP>EVDD). In this case, if power supply potential SAVDD satisfies

SAVDD<PCVDD=VPP then it can be equal to power supply potential EVDD, or it can be obtained by lowering power supply potential EVDD.

It is also possible to generate pre-charge potential PCVDD by causing power supply potential EVFF to be raised (PCVDD>EVDD), and to generated potential VPP and power supply potential SAVDD directly from power supply potential EVDD. At this time, array operation voltage VDDarray is set to VDDarray=EVDD-VTN and the pre-charge potential VBL is set to

VBL=(EVDD-VTN)/2

By setting various potentials in this way, the load of a step-up circuit is reduced which means that it is possible to reduce the surface area of the step-up circuit. Also, power consumption is reduced by the amount saved in the step-up circuit.

As has been described above, according to the semiconductor storage device of the present invention the occurrence of noise at the time of a sense operation can be suppressed, and a stable operation is obtained even if there are manufacturing variations.

It is also possible to design with a reduced array operation voltage while maintaining a high speed operation, as well as to layout the device with a narrower distance between elements, with the result that further reduction in surface area and reduced power consumption are realized.

Further, manufacture is possible without the need for a fine patterning process etc., and without any special process.

According to the semiconductor storage device of the present invention, it is possible to allow operation without erroneous sensing with a small read potential difference compared to the related art, even if the array operating voltage is the same as in the related art, which means that yield is improved.

What is claimed is:

1. A semiconductor storage device, comprising:

a memory cell array having memory cells, formed at crossing points of a plurality of word lines and a plurality of bit lines, arranged in the form of a matrix; and sense circuits, connected to the bit line pairs, for detecting data read out from the memory cells and amplifying the data, wherein the sense circuits include a preamplifier section for amplifying a potential difference of the bit line pair and a main amplifier section for further amplifying the potential difference amplified by the pre-amplifier section, the preamplifier section including
  a first switch circuit capable of electrically connecting or disconnecting one bit line of the bit line pair,
  a second switch circuit capable of electrically connecting or disconnecting the other bit line of the bit line pair,
  a third switch circuit, connected in series with the first switch circuit, capable of electrically connecting or disconnecting the one bit line of the bit line pair,
  a fourth switch circuit, connected in series with the second switch circuit, capable of electrically connecting or disconnecting the other bit line of the bit line pair,
  a first transistor having one electrode connected to one terminal of the third switch circuit, another electrode connected the other terminal of the third switch circuit, and a control electrode connected to one terminal of the fourth switch circuit,
  and a second transistor having one electrode connected to one terminal of the fourth switch circuit, another electrode connected to the other terminal of the fourth switch circuit, and a control electrode connected to one terminal of the third switch circuit, the main amplifier section including
  a first P channel type transistor having a source connected to a supply line of a first voltage supply, a drain connected to the one bit line, and a gate connected to the other bit line,
  a second P channel type transistor having a source connected to a supply line of the first voltage supply, a drain connected to the other bit line, and a gate connected to the one leg,
  a first N channel type transistor having a source connected a supply line of a second voltage supply via a fifth switch circuit, a drain connected to the one bit line, and a gate connected to the other bit line,
  and a second N channel type transistor having a source connected to the supply line of the second voltage supply via the fifth switch circuit, a drain connected to the other bit line, and a gate connected to the one bit line.

2. The semiconductor storage device as disclosed in claim 1, wherein the first switch circuit, the second switch circuit, the third switch circuit and the fourth switch circuit are formed of transistors having the same conductivity type as the first transistor and the second transistor.

3. The semiconductor storage device as disclosed in claim 1 or claim 2, wherein
  the sense circuit section comprises a bit line pre-charging circuit, having a third transistor and a fourth transistor, and functioning to pre-charge the bit line pair to a pre-charge potential, and
  the third transistor and the fourth transistor have the same conductivity type as the first transistor and the second transistor.

4. The semiconductor storage device as disclosed in claim 3, the pre-charge potential being less than half of the first power supply potential.

5. The semiconductor storage device as disclosed in claim 4, wherein the sense circuit comprises an equalizer circuit for equalizing the potential of a connection node between the first switch circuit and the third switch circuit, and equalizing the potential of a connection node between the second switch circuit and the fourth switch circuit.

6. The semiconductor storage device as disclosed in claim 5, wherein:
   the third switch circuit and the first transistor are formed in a first impurity diffusion region,
   the fourth switch circuit and the second transistor are formed in a second impurity diffusion region,
   a control electrode of a transistor constituting the third switch circuit is connected to one control signal supply line formed along the word lines,
   and the control electrode of the transistor constituting the fourth switching circuit is connected to another control signal supply line formed along the word lines.

7. A semiconductor storage device, comprising:
   a memory cell array formed at crossing points of a plurality of word lines and a plurality of bit line pairs, the bit line pair comprising a first bit line and a second bit line, and
   a sense circuit comprised of a pre-amplifier section for amplifying a potential difference of the bit line pair and a main amplifier section for further amplifying a potential difference amplified by the pre-amplifier section, the pre-amplifier section including
      a pre-sense node pair comprising a first pre-sense node and a second pre-sense node,
      a first switch circuit electrically connecting or disconnecting the first bit line and the first pre-sense node,
      a second switch circuit electrically connecting or disconnecting the second bit line and the second pre-sense node,
      a third switch circuit electrically connecting or disconnecting the first pre-sense node and a first main sense node of a main sense node pair in the main amplifier section,
      a fourth switch circuit electrically connecting or disconnecting the second pre-sense node and a second main sense node of the main sense node pair,
      a first transister having one electrode connected to one terminal of the third switch circuit, another electrode connected to the other terminal of the third switch circuit, and a control electrode connected to one terminal of the fourth switch circuit,
      and a second transistor having one electrode connected to one terminal of the fourth switch circuit, another electrode connected to the other terminal of the fourth switch circuit, and a control electrode connected to one terminal of the third switch circuit,
   the main amplifier section including
      the main sense node pair comprising the first main sense node and the second main sense node,
      a fifth switch circuit electrically connecting the first main sense node and a supply line of a first voltage supply,
      a sixth switch circuit electrically connecting the second main sense node and the supply line of the first voltage supply.

* * * * *